US007444609B2

(12) United States Patent
Charlebois et al.

(10) Patent No.: US 7,444,609 B2
(45) Date of Patent: Oct. 28, 2008

(54) METHOD OF OPTIMIZING CUSTOMIZABLE FILLER CELLS IN AN INTEGRATED CIRCUIT PHYSICAL DESIGN PROCESS

(75) Inventors: Steven E. Charlebois, Jericho, VT (US); Paul E. Dunn, Cambridge, VT (US); George W. Rohrbaugh, III, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 191 days.

(21) Appl. No.: 11/427,719

(22) Filed: Jun. 29, 2006

(65) Prior Publication Data

US 2008/0005712 A1    Jan. 3, 2008

(51) Int. Cl.
*G06F 17/50* (2006.01)
(52) U.S. Cl. .................................. 716/10; 716/8; 716/9
(58) Field of Classification Search ...................... 716/8, 716/9, 10
See application file for complete search history.

(56) References Cited

U.S. PATENT DOCUMENTS

| | | | |
|---|---|---|---|
| 6,321,371 B1 | 11/2001 | Yount, Jr. ..................... | 716/17 |
| 6,446,248 B1 | 9/2002 | Solomon et al. .............. | 716/17 |
| 6,470,476 B2 | 10/2002 | Bednar et al. .................. | 716/2 |
| 6,557,145 B2 | 4/2003 | Boyle et al. .................... | 716/2 |
| 6,748,579 B2 | 6/2004 | Dillon et al. .................. | 716/19 |
| 2003/0233625 A1 | 12/2003 | Brazell et al. ................. | 716/8 |
| 2004/0133868 A1 | 7/2004 | Ichimiya ....................... | 716/10 |
| 2004/0199879 A1 | 10/2004 | Bradfield et al. .............. | 716/1 |
| 2005/0039153 A1 | 2/2005 | Bednar et al. ................. | 716/12 |
| 2007/0124714 A1* | 5/2007 | Ono et al. ..................... | 716/10 |

* cited by examiner

*Primary Examiner*—Sun J Lin
(74) *Attorney, Agent, or Firm*—Downs Rachlin Martin PLLC

(57) ABSTRACT

A system and method for optimizing customizable filler cells in an integrated circuit physical design process. In particular, a filler cell placement algorithm of the present disclosure is utilized in the method to optimize the customizable filler cells in a circuit layout. The filler cell placement algorithm performs the operation of selecting a starting point within a given circuit layout, selecting a direction in which the position of logic cells is adjusted, adjusting the position of logic cells and, thereby, combining filler cells in order to increase the accumulated area thereof; suspending the adjustment operation when a customizable filler cell is formed; and resuming the adjustment operation from the point of the newly formed customizable filler cell. Additionally, a method of optimizing the locations, number, and distribution of the customizable filler cells in an integrated circuit design by use of the filler cell placement algorithm is provided.

20 Claims, 8 Drawing Sheets

METHOD OF OPTIMIZING CUSTOMIZABLE FILLER CELLS IN AN INTEGRATED CIRCUIT PHYSICAL DESIGN PROCESS

FIELD OF THE INVENTION

The present invention generally relates to the field of integrated circuit physical design. In particular, the present invention is directed to a system for and method of optimizing customizable filler cells in an integrated circuit physical design process.

BACKGROUND

Logic synthesis is a computer process that transforms a circuit description from one level of abstraction to a lower level, usually towards the physical implementation of an integrated circuit. As a result of the logic synthesis process, logic cells or logic functions are arranged physically in multiple circuit rows and/or circuit columns in order to form the completed design. Furthermore, each circuit row and/or circuit column contains multiple logic cells that are arranged adjacent one to another.

Additionally, there may exist gaps or empty spaces between certain adjacent logic cells. These empty spaces, sometimes referred to as "white spaces," exist in random locations and are of random sizes (i.e., areas) within the circuit design layout. "Filler cells" may be installed within these empty spaces. Filler cells are cells that are added to the design to fill the empty spaces within the circuit rows and/or circuit columns of the original circuit design. A filler cell may include, for example, one or more passive electronic devices, such as resistors or decoupling capacitors, or one or more active electronic devices, such as standard logic gates. Additionally, the size of the physical area of the filler cell determines the scope of functionality that may be incorporated therein. For example, a filler cell of a certain size may allow the incorporation of a decoupling capacitor only or a logic gate only. By contrast, a filler cell of a certain larger size may allow the incorporation of a more complex logic function, such as a gate array, which is a customizable device that is formed of combinatorial or sequential gates. A filler cell that is suitably large to incorporate a gate array is hereinafter referred to as a "customizable filler cell." A customizable filler cell is of greater use than a standard (i.e., non-customizable) filler cell, as a customizable filler cell provides the circuit designer the opportunity to incorporate circuit changes at any time via a backend release to manufacturing process only, which is a cost effective way to incorporate circuit modifications that may be required in ordered to remedy, for example, a functional problem or a circuit timing problem within the integrated circuit design.

Because the locations, sizes, and number of the empty spaces within a circuit design layout, which is the result of the placement algorithms in the logic synthesis operation, is random, the ability to incorporate customizable filler cells within the overall circuit design is not controlled. In particular, the locations of potential customizable filler cells are not controlled, in that, they may be clustered in one area only of the overall circuit layout or be distributed poorly (e.g., located at the perimeter only of the overall circuit layout). Consequently, the usefulness of the resulting customizable filler cells that exist in random locations, numbers, and distribution within the circuit design, for implementing circuit modifications, is limited. For these reasons, a need exists for a method of optimizing the locations, number, and distribution of customizable filler cells in an integrated circuit physical design process, in order to maximize the opportunity for implementing circuit modifications.

SUMMARY OF THE DISCLOSURE

In one aspect, a method of moving the placement of logic cells within a first region having a plurality of tracks is disclosed. The method comprises the steps of providing a circuit layout having a first region with a plurality of logic cells and a plurality of filler cells proximate ones of the plurality of logic cells. Each of the filler cells has a width that is less than a width $W^1$. The plurality of logic cells are moved so as to combine ones of the plurality of filler cells to form at least one customizable filler cell having a width of at least $W^1$.

The disclosure also provides a method of laying out a logic macro. The method includes synthesizing a logic macro having a plurality of logic cells arranged in a plurality of first regions, with each of said the plurality of first regions having a plurality of tracks. One or more of the plurality of first regions has at least two sections without a logic cell. At least some of the plurality of logic cells are moved within the one or more of the plurality of first regions so as to combine the at least two sections into one section. Wiring for said at least some of the plurality of logic cells is routed.

The disclosure also covers a computer readable medium containing computer executable instructions implementing a method of reducing traceability of electronic messages. The instructions comprise: a first set of instructions for providing a circuit layout having a first region with a plurality of logic cells and a plurality of filler cells proximate ones of the plurality of logic cells, each of the filler cells having a width that is less than a width $W^1$; and a second set of instructions for moving ones of the plurality of logic cells so as to combine ones of the plurality of filler cells in a manner forming at least one customizable filler cell having a width of at least $W^1$.

BRIEF DESCRIPTION OF THE DRAWINGS:

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Figure 1:
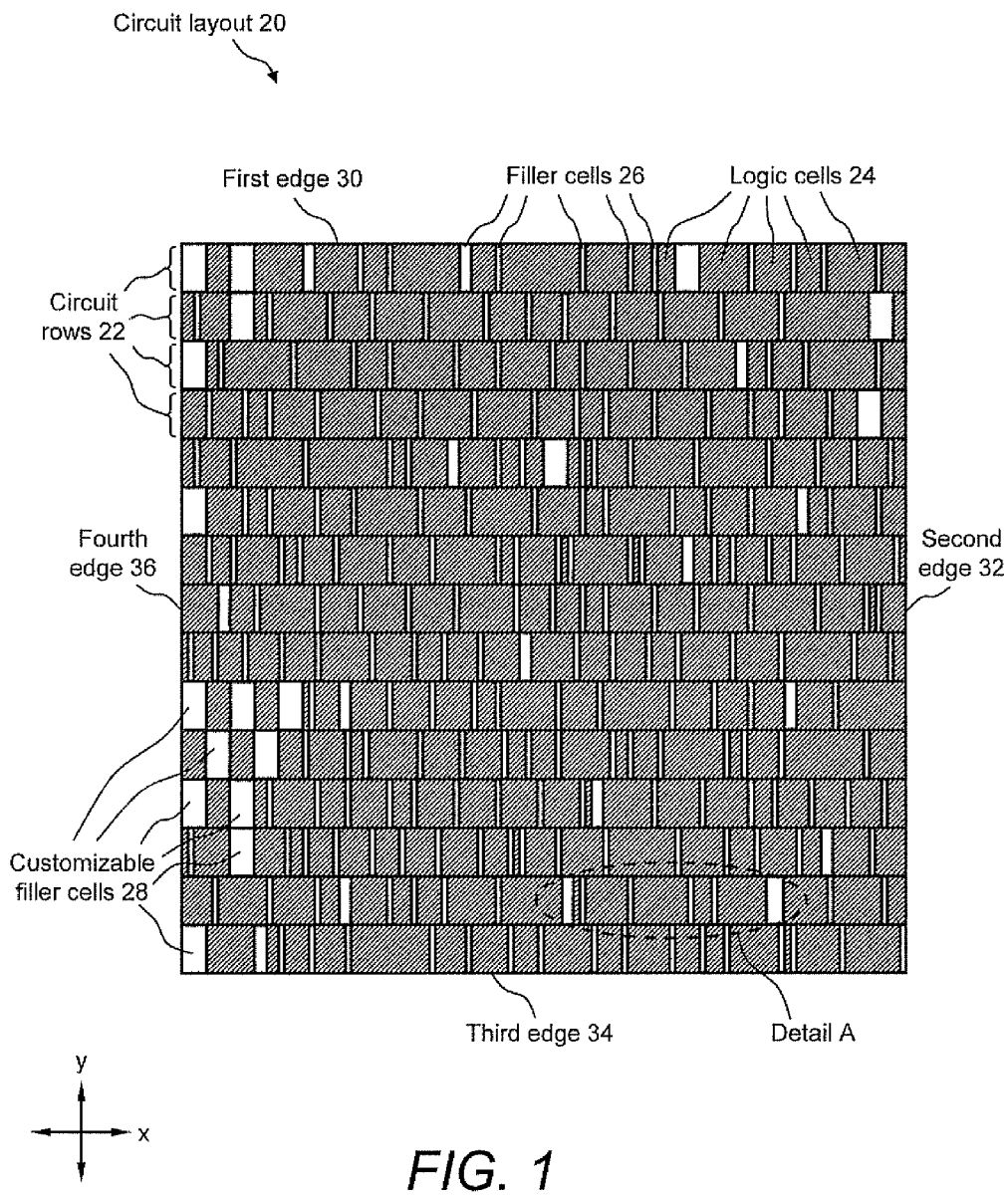
FIG. 1 schematically illustrates a circuit layout, which is a representative of any arbitrary circuit layout that results from a standard logic synthesis operation.

FIG. 1 illustrates a circuit layout 20, which is a representative of arbitrary circuit layouts that result from a standard logic synthesis operation. Circuit layout 20 includes a plurality of circuit rows 22 that each further includes a plurality of logic cells 24 that have a plurality of filler cells 26 and/or customizable filler cells 28 distributed randomly therein. The collective arrangement of circuit rows 22 forms the overall physical design of circuit layout 20, as shown in FIG. 1. As a result, circuit layout 20 has a first edge 30, a second edge 32, a third edge 34, and a fourth edge 36. Those skilled in the art will recognize that circuit layout 20 may be formed, alternatively, of circuit columns or other regions. The formation of circuit layout 20 by use of circuit rows 22 is exemplary only, and the method may be implemented with respect to regions in the circuit layout other than circuit rows.

Logic cells 24 represent a collection of specific logic functions, as required by a given integrated circuit functional design. The placement of all logic cells 24 is the result of a standard logic synthesis operation that is facilitated by any commercially available electronic design automation (EDA) tool, such as provided by Cadence® Design Systems, Inc. (San Jose, Calif.), that is suitable for semiconductor circuit design applications. Filler cells 26 are empty spaces, also known as white spaces, within circuit rows 22 of circuit layout 20 that are not sufficiently large (in area) to implement customizable gate array devices. Filler cells 26 are generally large enough to implement simple passive or active electronic devices. The minimum area needed in order to implement a customizable gate array device within circuit layout 20 is dependent on the specific semiconductor technology by which circuit layout 20 is implemented. Therefore, any filler cell whose size (in area) is less than that deemed suitable to implement a customizable gate array device for a given semiconductor technology is typically classified as a filler cell 26. By contrast, any filler cell whose size (in area) is equal to or greater than that deemed suitable to implement a customizable gate array device for a given semiconductor technology is typically classified as a customizable filler cells 28. By way of example, for a particular semiconductor technology the minimum area needed in order to implement a customizable gate array device within circuit layout 20 is the y-dimension of one circuit row 22×7.2 microns. Consequently, the area of each filler cell that is classified as a filler cell 26 is less than the y-dimension of one circuit row 22×7.2 microns and the area of each filler cell that is classified as a customizable filler cell 28 is equal to or greater than the y-dimension of one circuit row 22×7.2 microns.

With continuing reference to FIG. 1, it is observed that customizable filler cells 28 within circuit layout 20 are, for the most part, positioned near its perimeter. In particular, there is a high concentration of customizable filler cells 28 in close proximity to fourth edge 36. Consequently, it is observed that the instances of customizable filler cells 28 are not evenly distributed across the entire area of circuit layout 20.

Figure 2:
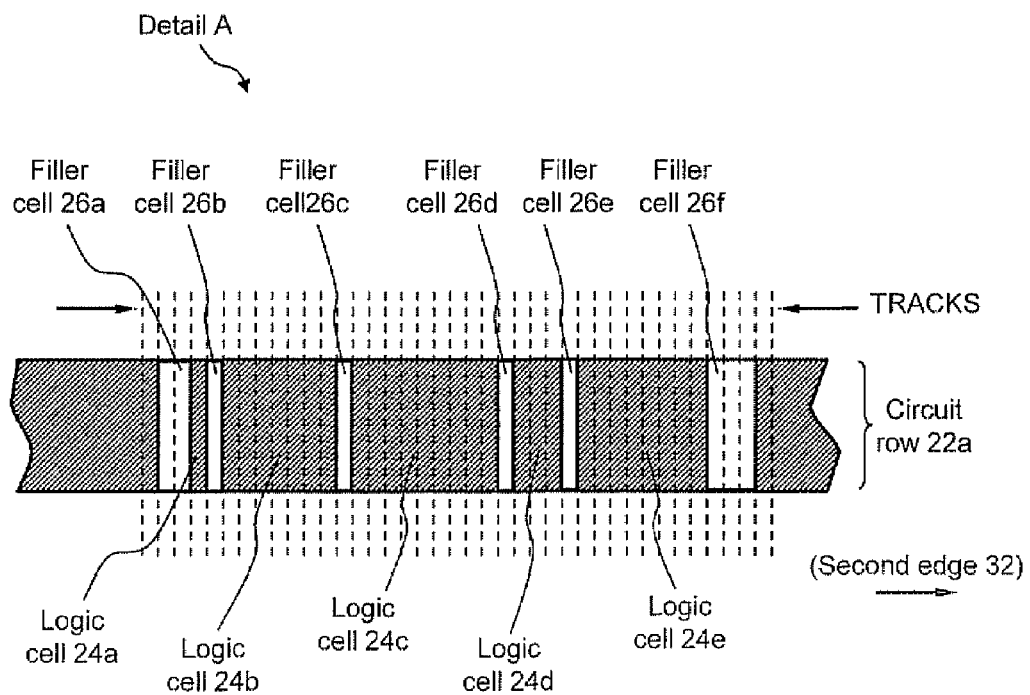
FIG. 2 illustrates an expanded view of a Detail A of FIG. 1.

FIG. 2 illustrates an expanded view of a Detail A of FIG. 1. In particular, Detail A of FIG. 2 shows a portion of a single circuit row 22, e.g., a circuit row 22a, that includes a sampling of logic cells 24, e.g., logic cells 24a through 24e, and a sampling of filler cells 26, e.g., filler cells 26a through 26f. More specifically, filler cell 26a and 26b are arranged on opposite boundaries of logic cell 24a, filler cell 26b and 26c are arranged on opposite boundaries of logic cell 24b, filler cell 26c and 26d are arranged on opposite boundaries of logic cell 24c, filler cell 26d and 26e are arranged on opposite boundaries of logic cell 24d, and filler cell 26e and 26f are arranged on opposite boundaries of logic cell 24e.

Additionally, in order to quantify the varying sizes of filler cells 26, FIG. 2 shows that each filler cell 26 is a certain number of TRACKS in width. The width of one TRACK correlates arbitrarily to the width of one wiring track for any given semiconductor technology. By way of example, one TRACK in FIG. 2 represents a wiring track width of 1.8 microns. Detail A of FIG. 2 shows, for example, that filler cell 26a is two TRACKS in width, filler cells 26b, 26c, 26d, and 26e are one TRACK in width, and filler cell 26f is three TRACKS in width. Furthermore, if for a given semiconductor technology the minimum spacing that is required between any two logic cells 24 is, for example, four TRACKS in order to implement a customizable filler cell 28, it is observed in FIG. 2 that no spacing between any two logic cells 24 meets this requirement. Details of a method of shifting slightly the positions of logic cells 24 in order to produce a customizable filler cell 28 are provided with reference to FIGS. 3A, 3B, and 3C.

Figure 3A:
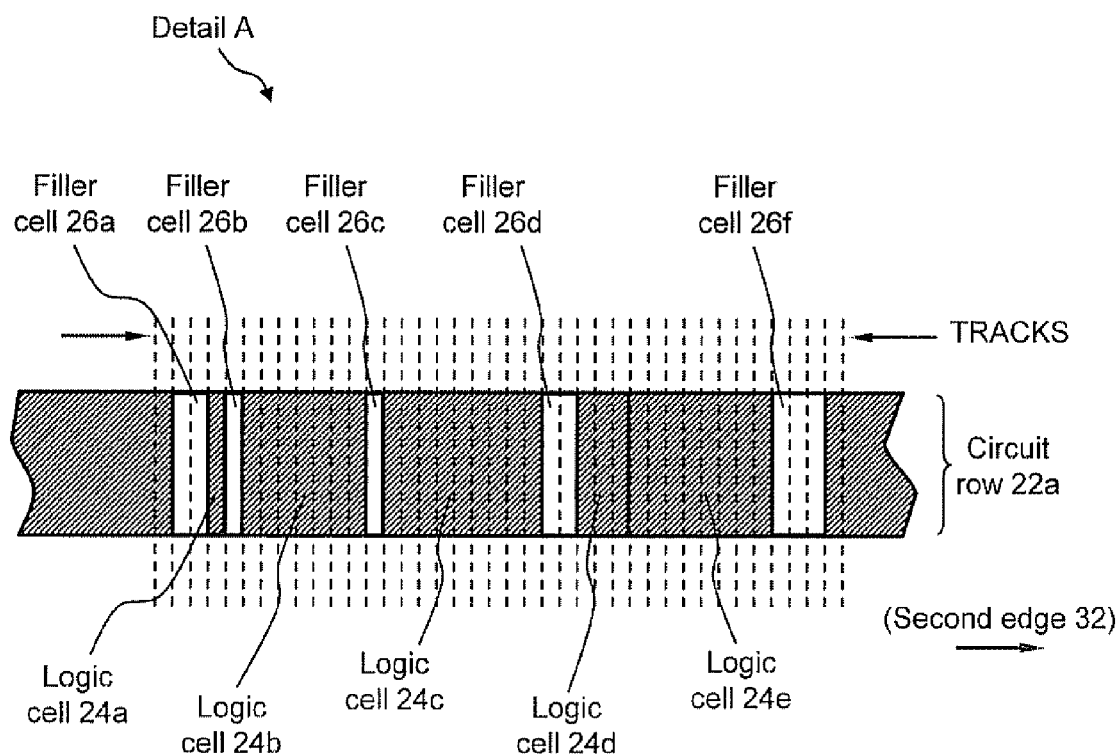
FIG. 3A illustrates Detail A of FIGS. 1 and 2 that is modified to show a first exemplary step of a logic cell position adjustment operation.

FIG. 3A illustrates Detail A of FIGS. 1 and 2 that is modified to show a first exemplary step of a logic cell position adjustment operation. In particular, Detail A of FIG. 3A shows that the position of logic cell 24d within circuit row 22a is shifted one TRACK toward second edge 32 of circuit layout 20. In doing so, filler cell 26e that is shown in Detail A of FIG. 2 is eliminated and filler cell 26d that is shown in Detail A of FIG. 2 is increased in width from one to two TRACKS.

Figure 3B:
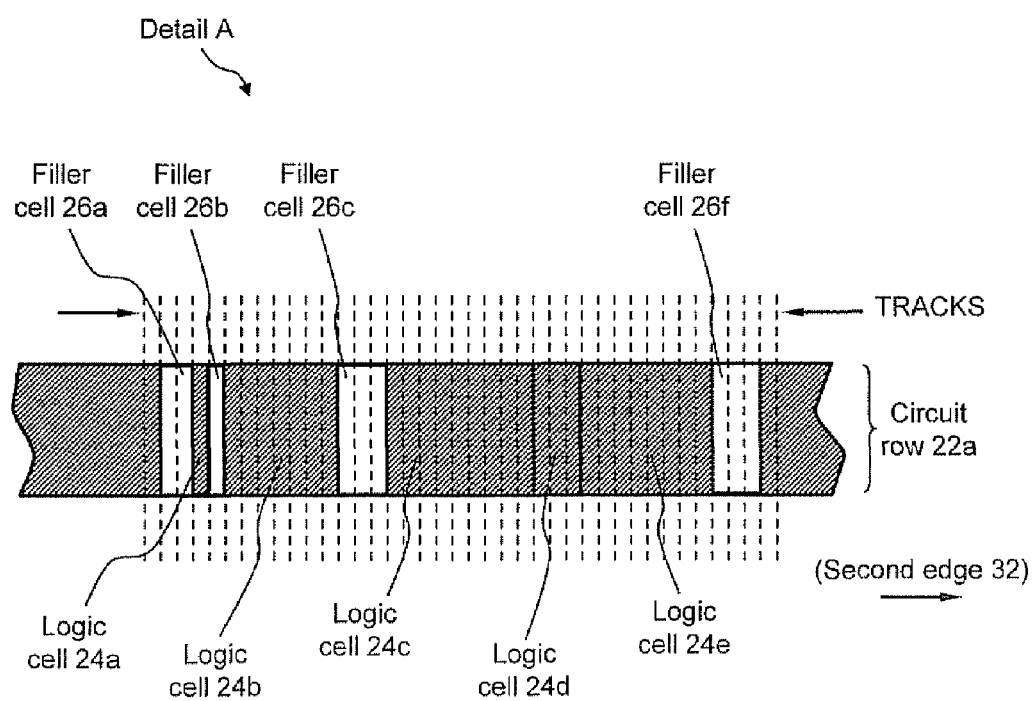
FIG. 3B illustrates Detail A of FIGS. 1 and 2 that is modified to show a second exemplary step of a logic cell position adjustment operation.

FIG. 3B illustrates Detail A of FIGS. 1 and 2 that is modified to show a second exemplary step of a logic cell position adjustment operation. In particular, Detail A of FIG. 3B shows that the position of logic cell 24c within circuit row 22a is shifted two TRACKS toward second edge 32 of circuit layout 20. In doing so, filler cell 26d that is shown in Detail A of FIG. 3A is eliminated and filler cell 26c that is shown in Detail A of FIG. 3A is increased in width from one to three TRACKS.

Figure 3C:
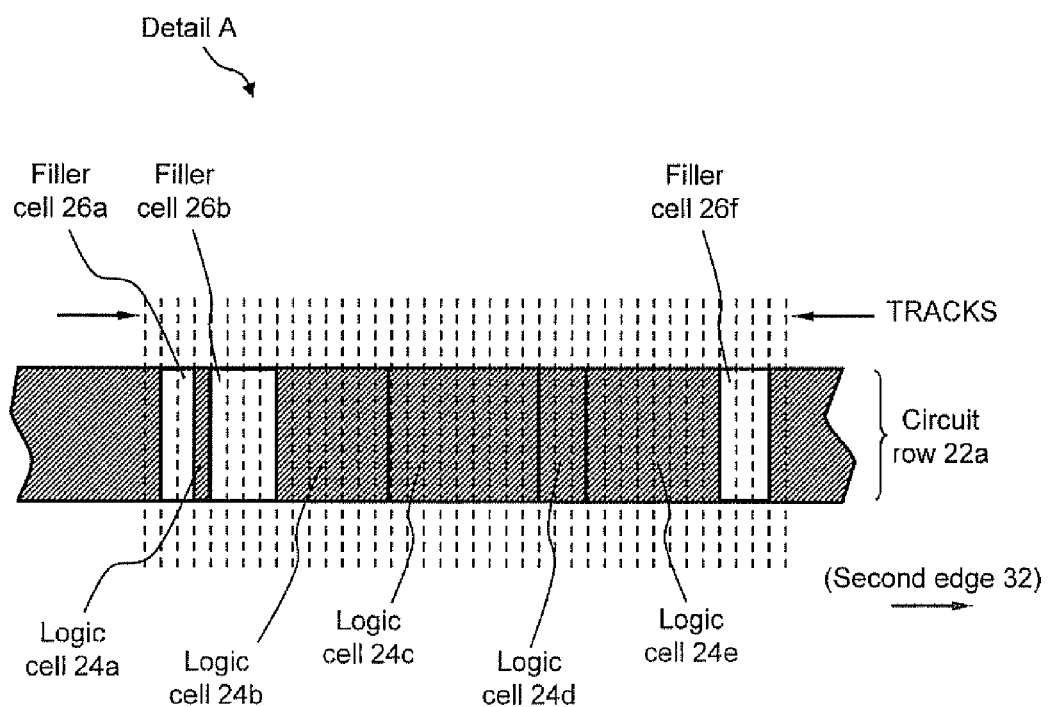
FIG. 3C illustrates Detail A of FIGS. 1 and 2 that is modified to show a third exemplary step of a logic cell position adjustment operation.

FIG. 3C illustrates Detail A of FIGS. 1 and 2 that is modified to show a third exemplary step of a logic cell position adjustment operation. In particular, Detail A of FIG. 3C shows that the position of logic cell 24b within circuit row 22a is shifted three TRACKS toward second edge 32 of circuit layout 20. In doing so, filler cell 26c that is shown in Detail A of FIG. 3B is eliminated and filler cell 26b that is shown in Detail A of FIG. 3B is increased in width from one to four TRACKS.

Figure 4:
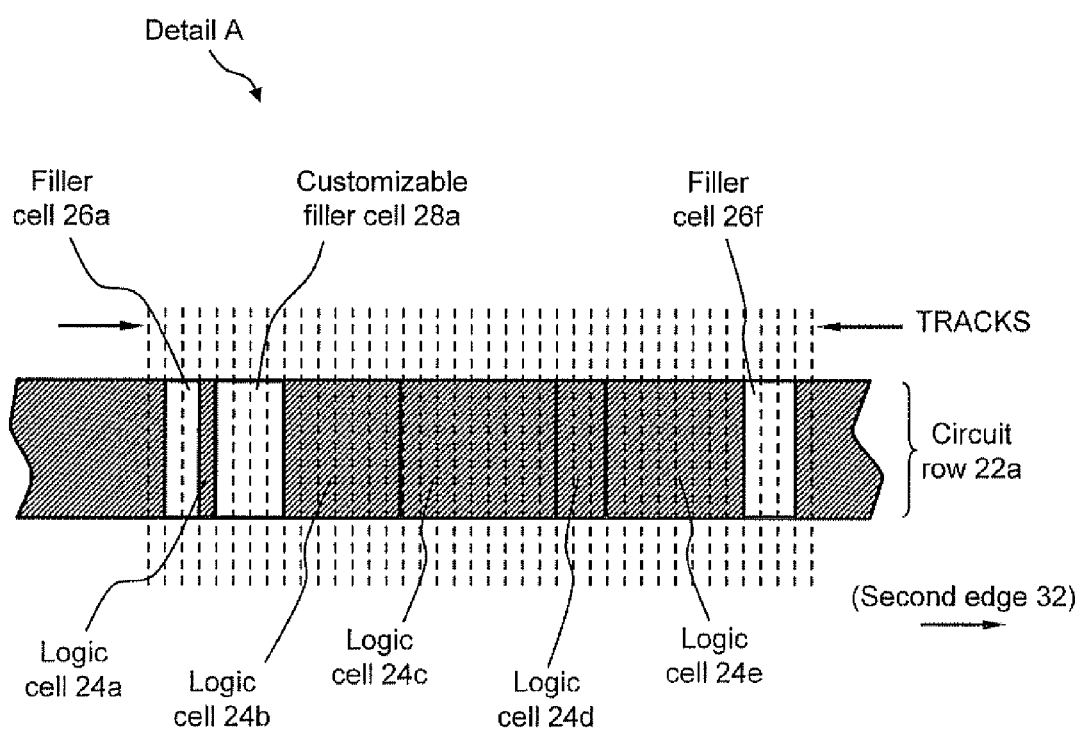
FIG. 4 illustrates Detail A that shows a customizable filler cell, which is the result of the operations described in FIGS. 3A, 3B, and 3C.

FIG. 4 illustrates Detail A that shows a customizable filler cell 28, which is the result of the operations described in FIGS. 3A, 3B, and 3C. More specifically, if, for example, it is pre-established that a filler cell 26 must be at least four TRACKS in width in order be classified as a customizable filler cell 28, filler cell 26b that is shown in Detail A of FIG. 3C is reclassified as a customizable filler cell 28a. Therefore, as a result of the operations that are described in FIGS. 3A, 3B, and 3C, circuit row 22a of Detail A of FIG. 2 is modified by shifting slightly the positions of multiple logic cells 24 in order to eliminate certain filler cells 26 and to form a customizable filler cell 28, such as customizable filler cell 28a, as shown in Detail A of FIG. 4. More details of an algorithm that performs the logic cell position adjustment operation, as described in FIGS. 3A, 3B, and 3C, are described with reference to FIGS. 5 and 6.

Figure 5:
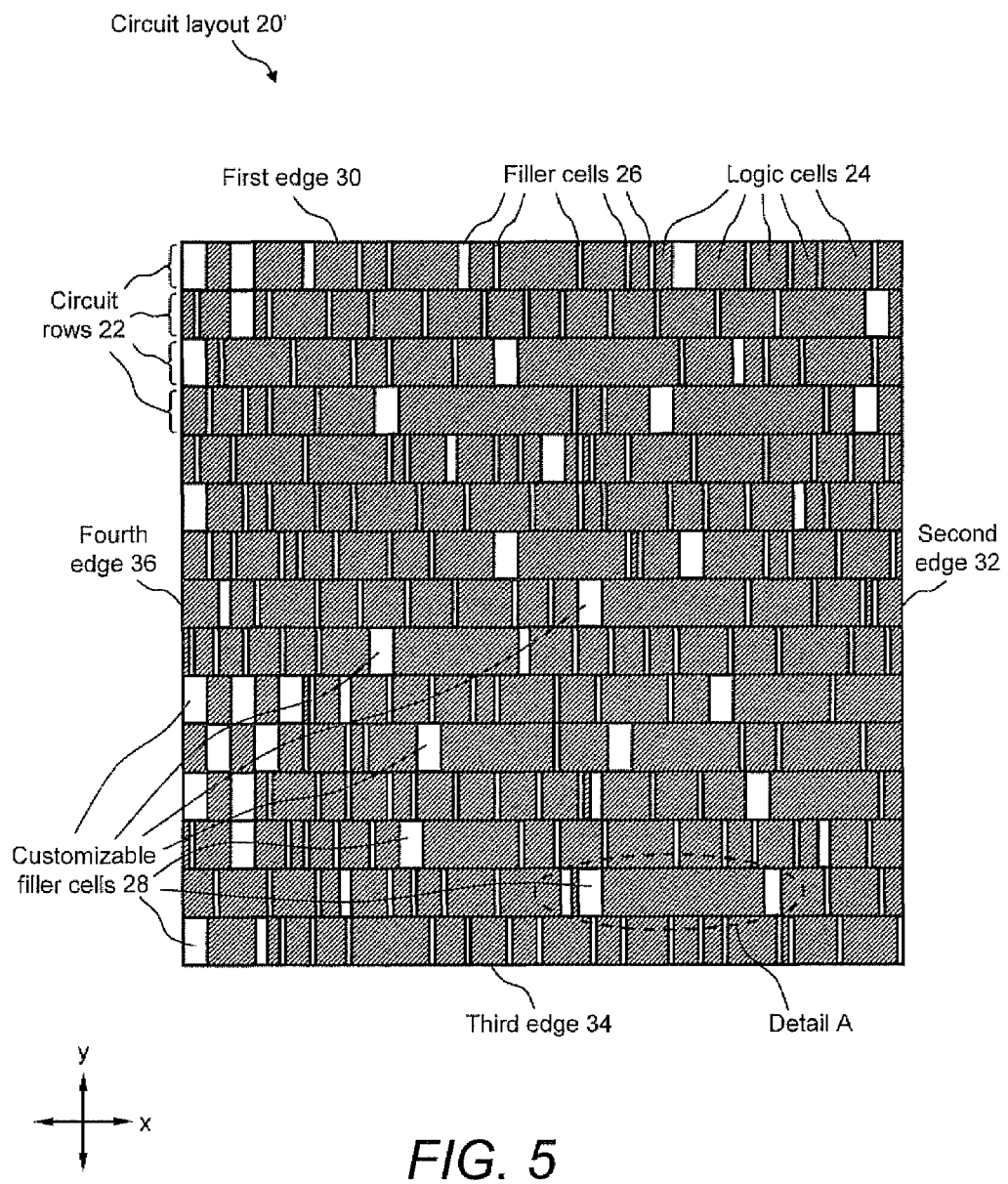
FIG. 5 schematically illustrates a circuit layout that is the result of executing a filler cell placement algorithm on the circuit layout of FIG. 1.

FIG. 5 illustrates a circuit layout 20' that is the result of executing a filler cell placement method on circuit layout 20 of FIG. 1, in accordance with the disclosure. In particular, a filler cell placement algorithm that performs a comprehensive operation to adjust the positions of filler cells 26 of all circuit rows 22 in order to increase the instances of customizable filler cell 28 and to optimize the distribution and placement thereof is executed on a circuit layout, such as circuit layout 20 of FIG. 1. An exemplary result, such as illustrated by circuit layout 20' of FIG. 5, shows the addition of multiple customizable filler cells 28 as compared with circuit layout 20 of FIG. 1. Additionally, FIG. 5 shows an improved distribution of customizable filler cells 28 across the entire area of circuit layout 20' of FIG. 5, as compared with circuit layout 20 of FIG. 1.

A filler cell placement algorithm of the present invention performs an iterative process that is executable within any standard EDA application, such as Cadence, which performs standard place and route operations that are associated with an integrated circuit physical design process. For each circuit row 22 of, for example, circuit layout 20 of FIG. 1, the operations of the filler cell placement algorithm include, but are not limited to, the following.

1. selecting a starting point within a given circuit layout, such as selecting a starting point near a particular edge or near the center of circuit layout 20;
2. selecting a direction in which the position of logic cells 24 is adjusted, such as from one edge toward an opposite edge of circuit layout 20, from the perimeter edges of circuit layout 20 toward its center, or from the center of circuit layout 20 toward its perimeter edges;
3. adjusting in the selected direction the position of logic cells 24 and, thereby, combine filler cells 26 in order to increase the accumulated area thereof;
4. suspending the adjustment operation when a customizable filler cell 28 is formed; and
5. resuming the adjustment operation from the point of the newly formed customizable filler cell 28.

Additionally, there are certain setup parameters that are associated with the filler cell placement algorithm of the present invention. Example parameters may include, but are not limited to, the following.

1. Filler cell target size—for a given semiconductor technology, this parameter establishes the minimum filler cell size that may be classified as a customizable filler cell 28. For example, this parameter may be set to 4, 8, 12 or 16 TRACKS;
2. Adjustment parameter—this parameter sets the adjustment direction of logic cells 24 within circuit layout 20. For example, for each circuit row 22 this parameter is set to second edge 32 toward fourth edge 36 only, fourth edge 36 toward second edge 32 only, or both second edge 32 and fourth edge 36 toward the center. Alternatively, for circuit layout 20 this parameter is set to one circuit row 22 to an adjacent circuit row 22 in any desired direction;
3. Starting point—this parameter sets the point from which to initiate the adjustment operation.

For example, this parameter is set to first edge 30, second edge 32, third edge 34, fourth edge 36, center of circuit layout 20, or a specific circuit row 22;

4. Maximum shift—this parameter sets the maximum amount of shift that is allowed for any individual logic cell 24. For example, for a filler cell target size of 4 TRACKS this parameter is set to 3, for a filler cell target size of 8 TRACKS this parameter is set to 7, for a filler cell target size of 12 TRACKS this parameter is set to 11, or for a filler cell target size of 16 TRACKS this parameter is set to 15;
5. Excluded areas—this parameter is set to identify critical areas to avoid within circuit layout 20, such as certain critical circuit rows/columns or portions thereof; and
6. Focus areas—this parameter is set to identify strategic areas within circuit layout 20 near which customizable filler cells 28 are most desired, such as certain strategic circuit rows/columns or portions thereof.

Figure 6:
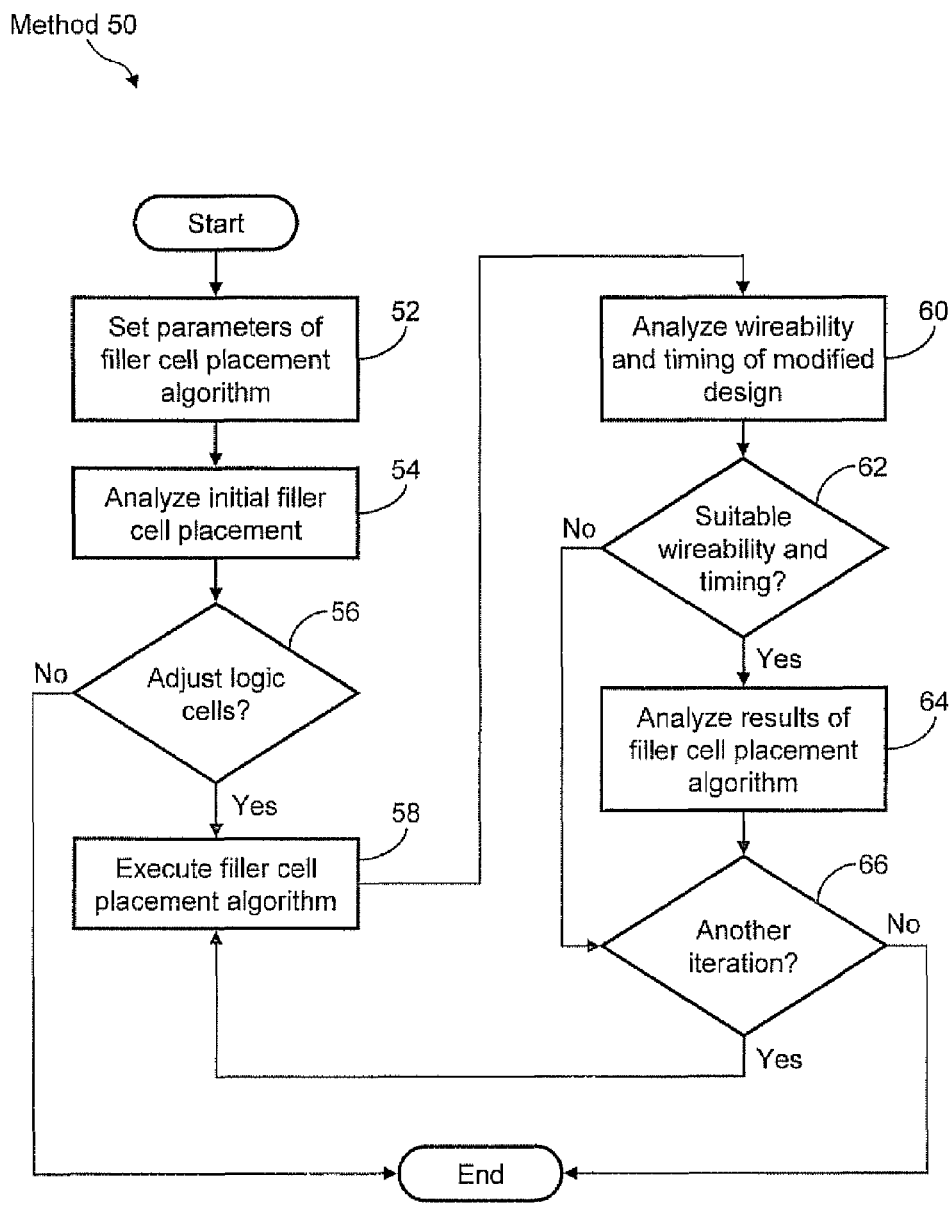
FIG. 6 illustrates a method of optimizing the customizable filler cells in an integrated circuit physical design process by use of the filler cell placement algorithm of the present invention.

FIG. 6 illustrates a method 50 of optimizing customizable filler cells 28 in an integrated circuit physical design process by use of the filler cell placement method of the present invention. In particular, method 50 of the present invention provides a way of optimizing the locations, number, and distribution of customizable filler cells 28 in an integrated circuit physical design process, in order to maximize the opportunity for implementing circuit modifications. Method 50 includes, but is not limited to, the following steps.

At step 52, the parameters of the filler cell placement algorithm, as described in FIG. 5, are set. Method 50 proceeds to step 54.

At step 54, after executing a synthesis operation on a given integrated circuit design, the initial configuration of customizable filler cells 28 and is analyzed. For example, after the synthesis operation, the placement of customizable filler cells 28 within each circuit row 22 of circuit layout 20 of FIG. 1 is analyzed in order to determine whether the location, number, and/or distribution of customizable filler cells 28 is adequate based, for example, on the size and complexity of the circuit design. Additionally, the analysis of step 54 may include determining whether additional customizable filler cells 28 are achievable by, for example, determining whether there are sufficient filler cells 26 to combine. Alternatively, based on x-y position only, it is determined whether the position of existing customizable filler cells 28 is satisfactory or whether it is beneficial to form customizable filler cells 28 at more strategic positions within circuit layout 20. Method 50 proceeds to step 56.

At decision step 56, based on the analysis of step 54, it is determined whether the positions of logic cells 24 of a given design require adjustment, in order to better optimize customizable filler cells 28. If yes, method 50 proceeds to step 58. If no, method 50 ends.

At step 58, the filler cell placement method is executed within any standard EDA application, such as Cadence, which performs standard place and route operations that are associated with an integrated circuit physical design process. In doing so, the positions of logic cells 24 are adjusted in order to form customizable filler cells 28, such as described in reference to FIGS. 3A, 3B, and 3C. Method 50 proceeds to step 60.

At step 60, the wireability and timing of the modified integrated circuit design, such as circuit layout 20' of FIG. 5, is verified. For example, a routing algorithm and a timing analysis algorithm of the EDA application is executed in order to verify wireability and timing, respectively, of the modified integrated circuit design. Method 50 proceeds to step 62.

At decision step 62, based on the results of step 60, it is determined whether the wireability and timing of the modified integrated circuit design is satisfactory. If yes, method 50 proceeds to step 64. If no, method 50 proceeds to step 66.

At step 64, the results of filler cell placement algorithm are analyzed in order to determine whether the locations, number, and distribution of the resulting customizable filler cells 28 are satisfactory. For example, this determination may be via a manual inspection operation or via an automated operation that utilizes any user-defined criterion. Example automated operations include, but are not limited to, calculating a percent increase in customizable filler cells 28, analyzing the x-y position of the resulting customizable filler cells 28, or calculating the number of customizable filler cells 28 per circuit row/column.

At decision step 66, based on the results of step 60 or 64, it is determined whether another iteration of the filler cell placement algorithm is required. If yes, method 50 returns to step 58. If no, method 50 ends.

An exemplary embodiment has been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A method of moving placement of logic cells within a first region having a plurality of tracks, the method comprising:
   providing a circuit layout having a first region with a plurality of logic cells and a plurality of filler cells proximate ones of said plurality of logic cells, each of said plurality of filler cells having a width that is less than a width $W^1$; and
   moving ones of said plurality of logic cells so as to combine ones of said plurality of filler cells to form at least one customizable filler cell having a width of at least $W^1$.

2. The method according to claim 1, wherein each one of the plurality of tracks has a width $W^2$ and said moving step is performed so that said width $W^1$ exceeds said width $W^2$.

3. The method according to claim 2, wherein said plurality of tracks includes at least four tracks.

4. The method according to claim 3, further comprising converting said at least one customizable filler cell into a combinatorial logic gate following a completion of said circuit layout.

5. The method according to claim 3, wherein said moving step is performed such tat said ones of said plurality of logic cells are located in said first region.

6. The method according to claim 1, further comprising rerouting said logic cells within said first region after said moving step.

7. The method according to claim 1, wherein said moving step involves moving each of said ones of said plurality of logic cells no more than a first amount.

8. The method according to claim 1, wherein said first region is a row of logic cells, and said ones of plurality of logic cells are moved within said row.

9. The method according to claim 1, wherein said first region is a column of logic cells and said ones of plurality of logic cells are moved within said column.

10. The method according to claim 1, including the step of selecting said first region based on a need for said at least one customizable filler cell within said circuit layout.

11. The method according to claim 1, wherein said moving step starts at a first location in said first region and said logic cells are moved in a first direction relative to said first location.

12. A method of laying out a logic macro, the method comprising:
    synthesizing a logic macro having a plurality of logic cells arranged in a plurality of first regions, each of said plurality of first regions having a plurality of tracks, wherein one or more of said plurality of first regions has at least two sections without a logic cell;
    placing at least some of said plurality of logic cells within said one or more of said plurality of first regions so as to combine said at least two sections into one section; and
    routing wiring for said at least some of said plurality of logic cells.

13. The method according to claim 12, wherein said placing step involves selecting one or more of said plurality of first regions as focus regions, and said placing step is performed with respect to ones of said plurality of logic cells in said focus regions.

14. The method according to claim 12, wherein said placing step involves selecting one or more of said plurality of first regions as excluded regions, and said placing step is performed with respect to ones of said plurality of logic cells in said excluded regions.

15. The method according to claim 12, wherein said placing step involves moving ones of said plurality of logic cells no more than a first distance so as to combine said at least two sections into one section.

16. A computer readable medium containing computer executable instructions implementing a method of moving placement of logic cells in a region having a plurality of tracks, the computer executable instructions comprising:
    a first set of instructions for providing a circuit layout having a first region with a plurality of logic cells and a plurality of filler cells proximate ones of said plurality of logic cells, each of said plurality of filler cells having a width that is less than a width $W^1$; and
    a second set of instructions for moving ones of said plurality of logic cells so as to combine ones of said plurality of filler cells in a manner forming at least one customizable filler cell having a width of at least $W^1$.

17. The computer readable medium according to claim 16, wherein each one of the plurality of tracks has a width $W^2$ and said second set of instructions is performed so that said width $W^1$ exceeds said width $W^2$.

18. The computer readable medium according to claim 16, wherein said second set of instructions is performed so that said width $W^1$ has a width exceeding four tracks.

19. The computer readable medium according to claim 16, wherein said second set of instructions is performed so that said ones of said plurality of logic cells are located in said first region.

20. The computer readable medium according to claim 16, wherein said second set of instructions is performed so that said width $W^1$ is large enough to accommodate a combinatorial or sequential logic gate.

* * * * *